(12) United States Patent
Mader et al.

(10) Patent No.: US 7,233,639 B2
(45) Date of Patent: Jun. 19, 2007

(54) UNFOOTED DOMINO LOGIC CIRCUIT AND METHOD

(75) Inventors: Roy Mader, Oceanside, CA (US); Bernard Bourgin, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 11/015,318

(22) Filed: Dec. 17, 2004

(65) Prior Publication Data
US 2006/0132188 A1    Jun. 22, 2006

(51) Int. Cl.
*H03K 19/096* (2006.01)
(52) U.S. Cl. .............................. 376/97; 326/95; 326/98
(58) Field of Classification Search ............ 326/93–98, 326/112, 119, 121
See application file for complete search history.

(56) References Cited

U.S. PATENT DOCUMENTS

| | | | |
|---|---|---|---|
| 5,041,742 A | | 8/1991 | Carbonaro |
| 5,434,520 A | * | 7/1995 | Yetter et al. ................... 326/93 |
| 5,883,529 A | | 3/1999 | Kumata et al. |
| 5,930,148 A | | 7/1999 | Bjorksten et al. |
| 6,040,716 A | * | 3/2000 | Bosshart ...................... 326/98 |
| 6,209,121 B1 | | 3/2001 | Goto |
| 2004/0155678 A1 | | 8/2004 | Anderson et al. |
| 2005/0110522 A1 | * | 5/2005 | Hoekstra ..................... 326/95 |

OTHER PUBLICATIONS

D. Harris, "Skew-Tolerant Circuit Design", Morgan Kaufman Publishers, San Francisco, CA 2001, Chapter 1, pp. 1-31 and section 3.2., pp. 79-95, no month.
K. Bernstein et al., "High Speed CMOS Design Styles", Kluwer Academic Publishers, Boston, 1998, pp. 91-131, no month.

* cited by examiner

*Primary Examiner*—Anh Q. Tran
(74) *Attorney, Agent, or Firm*—Lisa K. Jorgenson; William J. Kubida

(57) ABSTRACT

A domino clocking method includes providing a domino logic circuit including first and second coupled domino gates, providing a first clock signal for clocking the first domino gate, and providing a second clock signal for clocking the second domino gate, wherein the first clock signal has a shortened positive phase duty cycle relative to the second clock signal. The positive phase of the first clock signal is shortened by an amount greater than or equal to a precharge time plus a falling edge skew between the clock signals. The footer transistor in the second domino gate can be eliminated. The first and second clock signals have the same frequency. The timing of the data presented to the first domino gate, and the first and second clock signals is adjusted so that there is no direct path between the power supply voltage and ground during the entire precharge phase of the second domino gate.

17 Claims, 3 Drawing Sheets

UNFOOTED DOMINO LOGIC CIRCUIT AND METHOD

BACKGROUND OF THE INVENTION

The present invention relates to domino logic circuits. More particularly, the present invention relates to a circuit and method of enabling the elimination of the clocked evaluation transistor (footer transistor) in traditional domino logic gates by using clocks with differing duty cycles to control cascaded domino gates.

A typical N-type prior art domino circuit 10 is shown in FIG. 1(a). Domino circuit 10 is made up of three distinct transistor arrangements. First, domino circuit 10 has one or two clocked transistors MN0 and MP0. The first clock transistor is P-channel transistor MP0, which is the precharge transistor and its presence is mandatory in every domino circuit. The second clocked transistor is N-channel transistor MN0, which is the evaluation transistor or "footer" transistor and can be omitted from circuit 10 in certain cases, which is described in further detail below. If the footer transistor is present in the domino logic gate, it is known as a "footed" domino gate. If the footer transistor is omitted, it is known as an "unfooted" domino gate. The second element of a domino circuit is the output driver, which includes P-channel transistor MP1 and N-channel transistor MN3 as is shown in FIG. 1(a). The driver is shown as an inverter in the example of FIG. 1(a), but it can be any inverting function (e.g. NOR, or NAND). Finally, domino circuit 10 contains one or more N-channel transistors between node 'ZA' and ground (or between node 'ZA' and the footer transistor, if one is present). These transistors, which are shown as N-channel transistors MN1 and MN2 in FIG. 1(a), are known as the "pull down stack" (or "pull down network") and their arrangement determines the logic function realized by domino gate 10. The pull down stack is equivalent to the N-channel pull down stack in traditional static CMOS logic gates. The logic symbol for a domino AND logic gate 12 is shown in FIG. 1(b) corresponding to the circuit 10 shown in FIG. 1(a).

The basic operation of a domino gate consists of two phases. During the first phase, known as the precharge phase, the clock signal is low. Transistor MP0 is active and allows node 'ZA' to charge to a power supply voltage level 'VDD'. A direct path to ground, which would prevent node 'ZA' from being charged fully is prevented by transistor MN0 which is in the cutoff state during precharge. The presence of transistor MN0 in circuit 10 guarantees correct operation of the gate independent of the voltage levels on the gates of the transistors MN1 and MN2 in the pull down network. During precharge, the output node 'Z' goes low in response to node 'ZA' being pulled high. The second phase of a domino circuit's operation is the evaluation phase, which starts when the clock goes high. The internal precharge node 'ZA' either remains charged or is discharged through the pull down stack and footer transistor, depending on the voltage levels on the gates of the pull down transistors. Hence, the output node 'Z' either remains low or goes high during the evaluation phase.

The purpose of the footer transistor MN0 is to ensure that there is no direct path to ground during the time that circuit 10 is precharging (when the clock signal is low). However, the inclusion of a footer transistor is undesirable for three reasons. First, the domino logic circuit slows down due to having an extra series transistor through which node 'ZA' must be discharged. The second consequence of using a footer transistor is increased power consumption since the clock tree loading is increased by this transistor. Finally, the area of a footed domino cell may be larger, although layout constraints may dictate the same cell area for both a footed and unfooted version of a given domino gate.

As is known in the prior art, the footer transistor in a domino cell can be eliminated if at least one transistor in every path to ground is turned off at any given time, for the duration of the precharge cycle. If one of the paths to ground is turned on during the precharge cycle, then the cell may never precharge correctly and consequently it may evaluate a wrong value. Alternatively, the precharge time may increase significantly, creating a violation later on in the path. It has been suggested that it is safe to use unfooted domino logic in a configuration in which the inputs to the pull down network may go high during the second half of the precharge cycle. However, this condition causes excessive power to be consumed since there is a direct path from VDD to ground.

When using traditional domino clocking techniques, the conditions to eliminate the footer transistor cannot be guaranteed except in special cases. The footer transistor can be eliminated if the following conditions are met. Multiple overlapping phases must be used to clock the domino circuits and every path to ground must contain at least two transistors, each driven by domino gates that are clocked by a different phase. Specifically, one transistor must be driven by a cell clocked with the same phase that the unfooted cell is on, while the other transistor must be driven by a domino cell clocked by the previous adjacent phase (e.g., an unfooted cell clocked with $\Phi 2$ must have inputs driven by clock signals having phases $\Phi 1$ and $\Phi 2$). This is illustrated in FIGS. 2 and 3. FIG. 2 is a prior art domino logic circuit 20 in which the footer transistor is eliminated, and FIG. 3 is a timing diagram 30 associated with the prior art domino logic circuit shown in FIG. 2. In the example shown in FIG. 2, cascaded domino gates U1, U2, and U3 are shown with gate U1 being clocked by the $\Phi 1$ clock signal and gate U2 being clocked by the $\Phi 2$ clock signal. This is a typical prior art domino clocking scheme which makes use of overlapping, phase-shifted clocks. The input timing conditions to eliminate the footer transistor in domino gate U2 are satisfied since transistor MN1 is driven by a gate clocked by $\Phi 1$ and transistor MN2 is clocked by $\Phi 2$, and together these transistor constitute the only path to ground. When gate U1 enters the precharge phase, the input A to transistor MN1 goes low, thus preventing a direct path from VDD to ground when U2 enters the precharge phase. When $\Phi 1$ goes high and U1 evaluates, the A input to transistor MN1 goes high. However, the input B at transistor MN2 remains low since it is driven by domino gate U3 which is also clocked by $\Phi 2$. Hence, the footer transistor can safely be eliminated for domino circuit U2. While the use of unfooted domino is partially described in the prior art, the analysis does not include all conditions necessary to safely use an unfooted domino logic gate. This is because in every pull down path there must also be a transistor clocked by the same phase as the phase the unfooted domino gate to which it is assigned. As discussed above, if this condition is not satisfied, then when the gates clocked with the earlier phase signal go into evaluation mode, the unfooted gate is still in the precharge mode. Hence, there is a direct path between VDD and ground, which causes excessive power dissipation as well as causing the gate to evaluate during precharge.

What is desired, therefore, is use of unfooted domino logic gates and a corresponding method that does not have the power, speed, and die area penalties associated with prior art footed domino logic techniques.

SUMMARY OF THE INVENTION

According to an embodiment of the present invention, a domino clocking method includes providing a domino logic circuit including first and second coupled domino gates, providing a first clock signal for clocking the first domino gate, and providing a second clock signal for clocking the second domino gate, wherein the first clock signal has a shortened positive phase duty cycle relative to the second clock signal. The positive phase of the first clock signal is shortened by an amount greater than or equal to a precharge time plus a falling edge skew between the clock signals. The footer transistor in the second domino gate can be eliminated. The first and second clock signals have the same frequency. Due to the timing of the first and second clock signals, the timing of the data to the second domino gate ensures that there is no direct path between the power supply voltage and ground during the entire precharge phase of the second domino gate.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1B:
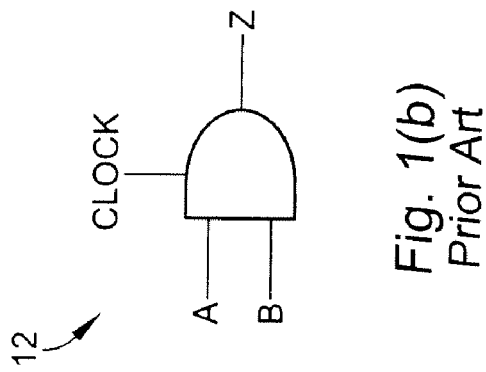
FIG. 1(b) is a logic symbol representation of the domino logic gate shown in FIG. 1(a)
Figure 1A:
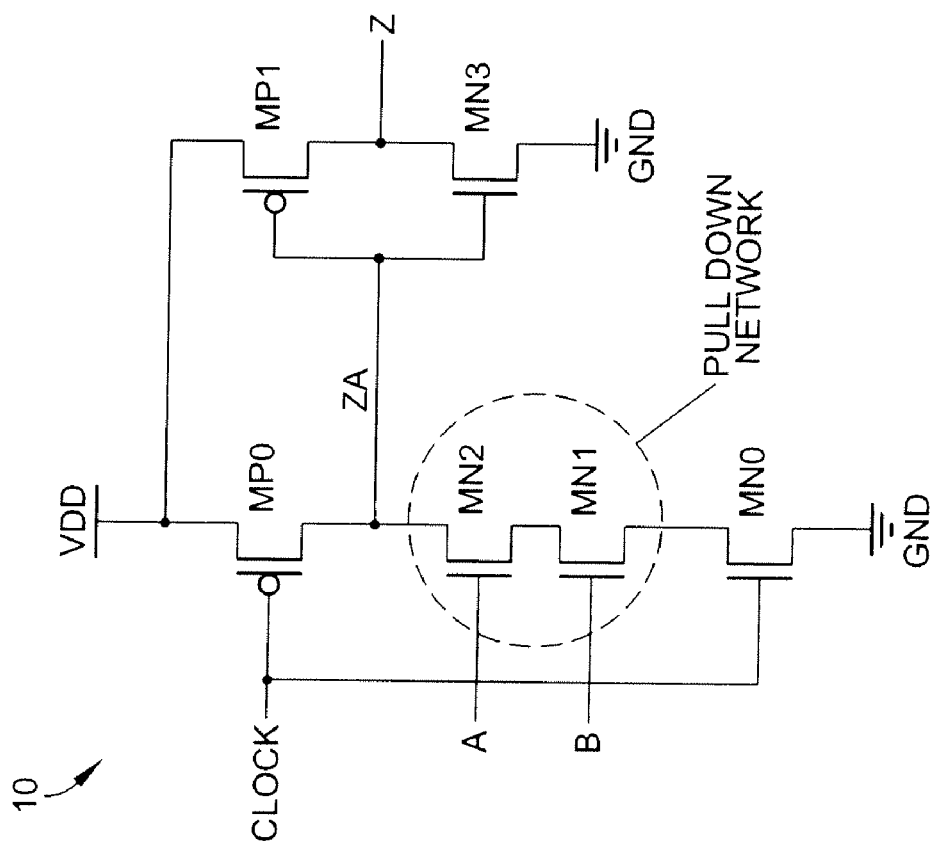
FIG. 1(a) is a schematic diagram of a typical prior art domino logic gate.
Figure 2:
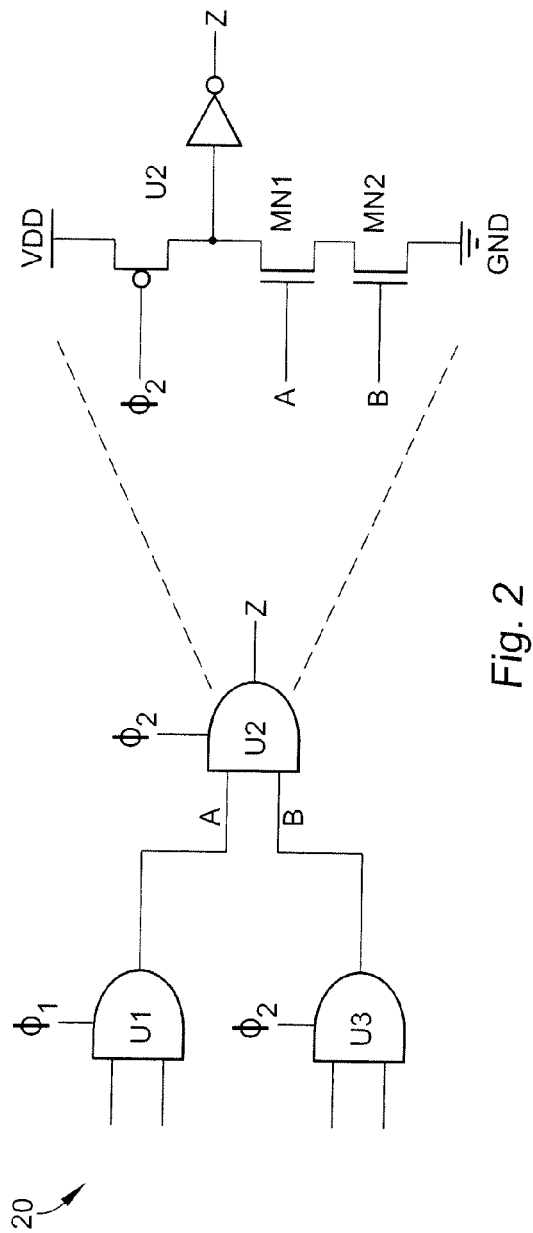
FIG. 2 is schematic/logic diagram of a prior art domino logic circuit in which the footer transistor is eliminated.
Figure 3:
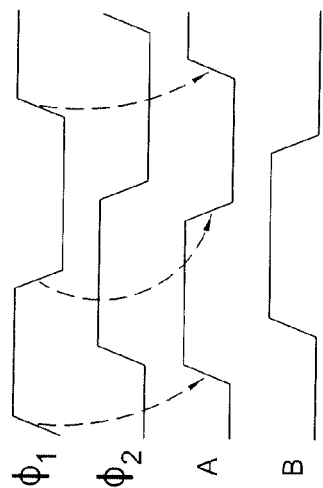
FIG. 3 is a timing diagram associated with the prior art domino logic circuit of FIG. 2.
Figure 5:
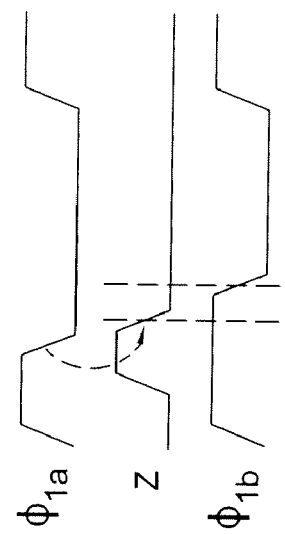
FIG. 5 is a timing diagram associated with the operation of the domino logic circuit shown in FIG. 4.
Figure 4:
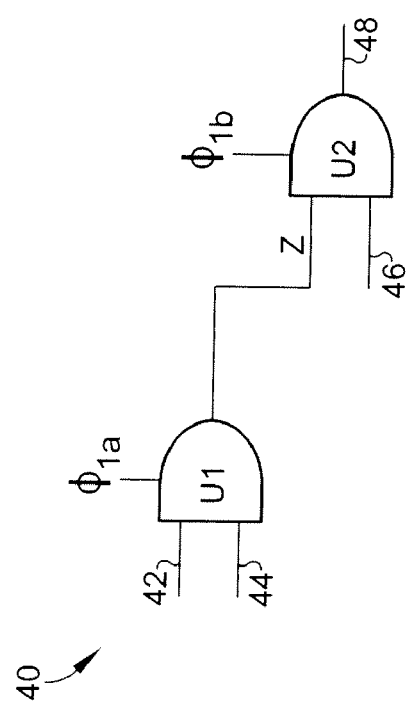
FIG. 4 is a schematic diagram of a domino logic circuit according to an embodiment of the present invention.

Referring now to FIGS. 4 and 5, a domino logic circuit 40 according to an embodiment of the present invention, and an associated timing diagram 50 is shown. The clocking method of the present invention allows greater use of unfooted domino logic as compared to traditional domino logic clocking techniques. In the method of the present invention, two versions of a clock signal are used, with one clock signal (Φ1A) having a shortened positive phase of the duty cycle relative to the other signal (Φ1B). As is known if the prior art, the duty cycle of a clock signal is a measure of the percentage that the clock is high versus when it is low. In the method of the present invention, one clock signal (Φ1B) is high for a longer period of time than the other clock signal (Φ1A), although the frequency of the two clock signals is the same. The Φ1A and Φ1B clock signals are then used to control cascaded domino gates U1 and U2. In general, according to the method of the present invention, an unfooted domino logic gate may be used in a given domino circuit if every path to ground in the domino circuit contains at least one transistor that is driven by a domino cell clocked with a shortened duty-cycle version of the clock phase that drives the candidate cell. The method of the present invention enables the expanded use of unfooted domino logic. By using unfooted domino logic, typical domino designs will have lower power, a faster clock period and smaller integrated circuit die area.

An example of the proposed circuit and design methodology is shown in FIGS. 4 and 5. Circuit 40 includes domino gates 'U1' and 'U2', data inputs 42, 44, 46, and output node 48. In the circuit example 40 of FIG. 4, a domino gate 'U1' is clocked by the signal 'Φ1A'. Clock 'Φ1A' has a shorter duty cycle relative to clock 'Φ1B', which controls domino gate 'U2'. During operation, the output node 'Z' goes low in response to the falling edge of clock signal 'Φ1A'. The 'U1' gate is characterized with a precharge time 'TP' that represents the amount of time that it takes node 'Z' to go low in response to 'Φ1A' going low. Another parameter of importance is the difference in the clock arrival times, known as skew ('Tskew'='Φ1A arrival time'−'101 1B arrival time'). The skew can be defined relative to either the rising or falling edges of the clock signals. ('Tskew_rise' or 'Tskew_fall').

If the positive phase of 'Φ1A' is shortened by an amount greater than or equal to (TP+'Tskew_fall') then node 'Z' is guaranteed to be low by the time gate 'U2' enters precharge (when 'Φ1B' goes low). Hence, transistor 'MN1' is in a cutoff state when gate 'U2' enters the precharge phase. Furthermore, since the rising edge of 'Φ1A' and 'Φ1B' occur at the same relative time (shifted by 'Tskew_rise'), then transistor 'MN1' remains cutoff for the duration of the precharge phase of domino cell 'U2'. If 'Tskew_rise' is positive then transistor 'MN1' is in cutoff for the entire precharge phase of gate 'U2'. If 'Tskew_rise' is negative ('Φ1B' rises after 'Φ1A'), then gate 'U2' may evaluate early and there is a direct path between VDD and ground for a time equal to 'Tskew_rise'−the domino cell's evaluate time. This condition does not lead to a functional failure of the circuit assuming the delay variation of 'U2's evaluation time due to 'Tskew_rise' is taken into account during design and timing analysis. However, it is preferable to avoid the increase in power due to skew in this situation. Where such a problem may occur 'Tskew_rise' should ideally be closely controlled to be either negative or of an acceptably small value. Furthermore, in a traditional domino design the optimal phase assignment for distributing the clocks to the domino gates, results in data at nodes 42, 44, and 46 arriving after the clock signal. This timing relation makes the previously described situation (output rising due to clock rising) extremely unlikely. Therefore, there is no catastrophic danger from a direct path between VDD and ground during the entire precharge phase of domino gate 'U2'. Hence, the footer transistor can be safely eliminated from gate 'U2'.

While there have been described above the principles of the present invention in conjunction with a preferred embodiment thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A domino clocking method comprising:
   providing a domino logic circuit including first and second coupled domino gates, wherein an output of the first domino gate is coupled to an input of the second domino gate;
   providing a first clock signal for clocking the first domino gate;
   providing a second clock signal for clocking the second domino gate, wherein the first clock signal has a shortened positive phase duty cycle relative to the second clock signal; and
   shortening the positive phase of the first clock signal by an amount greater than or equal to a precharge time plus a falling edge skew, wherein the falling edge skew is defined as the fall time of the first clock signal minus the fall time of the second clock signal.

2. The method of claim 1 wherein the first and second clock signals comprise the same frequency.

3. The method of claim 1 wherein providing the second domino gate comprises providing an unfooted domino gate.

4. The method of claim 1 wherein providing the second domino gate comprises providing a second domino gate comprising a precharge transistor and for every path to ground an additional transistor coupled between the precharge transistor and ground, such that an input signal to the additional transistor can be controlled to cutoff the additional transistor and prevent a direct path between a power source for the domino logic circuit and ground.

5. The method of claim 4 further comprising controlling the input of the additional transistor such that the additional transistor is cutoff during the entire precharge phase of the second domino gate.

6. The method of claim 1 wherein the falling edge of data presented to the second domino gate arrives before the falling edge of the second clock signal.

7. The method of claim 1 wherein the timing of the data presented to the first domino gate, and the first and second clock signals is adjusted so that there is no direct path between a power supply voltage and ground during an entire precharge phase of the second domino gate.

8. A domino logic circuit comprising:
   first and second coupled domino gates, wherein an output of the first domino gate is coupled to an input of the second domino gate;
   a first clock signal for clocking the first domino gate;
   a second clock signal for clocking the second domino gate, wherein the first clock signal has a shortened positive phase duty cycle relative to the second clock signal; and
   means for shortening the positive phase of the first clock signal by an amount greater than or equal to a precharge time plus a falling edge skew, wherein the falling edge skew is defined as the fall time of the first clock signal minus the fall time of the second clock signal.

9. The circuit of claim 8 wherein the first and second clock signals comprise the same frequency.

10. The circuit of claim 8 wherein the second domino gate comprises an unfooted domino gate.

11. The circuit of claim 8 wherein the second domino gate comprises a precharge transistor and an additional transistor coupled between the precharge transistor and ground, such that an input signal to the additional transistor can be controlled to cutoff the additional transistor and prevent a direct path between a power source for the domino logic circuit and ground.

12. The circuit of claim 8 wherein the second domino gate comprises a precharge transistor and for every path to ground an additional transistor coupled between the precharge transistor and ground, such that the additional transistor is cutoff during the entire precharge phase of the second domino gate.

13. The circuit of claim 8 wherein the first domino gate comprises:
   a P-channel transistor having a source coupled to a source of power supply voltage, a gate for receiving the first clock signal, and a drain coupled to the input of the output driver of the first domino gate;
   a first N-channel transistor having a drain coupled to the input of the output driver of the first domino gate, a gate for receiving a first input signal, and a source; and
   a second N-channel transistor having a drain coupled to the source of the first N-channel transistor, a gate for receiving a second input signal, and a source coupled to ground.

14. The circuit of claim 8 wherein an N-channel transistor of the second domino gate is in a cutoff state when the second domino gate enters a precharge phase.

15. The circuit of claim 8 further comprising means for adjusting the timing of the first and second clock signals so that there is no direct path between a power supply voltage and ground during an entire precharge phase of the second domino gate.

16. A method of operating a domino logic circuit wherein an output of a first domino gate is coupled to an input of a second domino gate, the method comprising:
   clocking the first domino gate with a first clock signal having a first duty cycle;
   clocking the second domino gate coupled to the first domino gate with a second clock signal having a second duty cycle; and
   eliminating a footer transistor in the second domino; and
   shortening the positive phase of the first clock signal by an amount greater than or equal to a precharge time plus a falling edge skew, wherein the falling edge skew is defined as the fall time of the first clock signal minus the fall time of the second clock signal.

17. The method of claim 16 wherein the first and second clock signals comprise the same frequency.

* * * * *

UNITED STATES PATENT AND TRADEMARK OFFICE
CERTIFICATE OF CORRECTION

| | | |
|---|---|---|
| PATENT NO. | : 7,233,639 B2 | Page 1 of 1 |
| APPLICATION NO. | : 11/015318 | |
| DATED | : June 19, 2007 | |
| INVENTOR(S) | : Roy Mader and Bernard Bourgin | |

It is certified that error appears in the above-identified patent and that said Letters Patent is hereby corrected as shown below:

Column 6, line 49, after domino insert "gate"

Signed and Sealed this

Fourth Day of September, 2007

JON W. DUDAS
*Director of the United States Patent and Trademark Office*